United States Patent [19]

Ikeda et al.

[11] Patent Number: 5,265,316
[45] Date of Patent: Nov. 30, 1993

[54] METHOD OF MANUFACTURING A PRESSURE SEAL TYPE PIEZOELECTRIC OSCILLATOR

[75] Inventors: Tatsuo Ikeda; Hiroyuki Ogiso; Kazushige Ichinose, all of Minowa, Japan

[73] Assignee: Seiko Epson Corporation, Tokyo, Japan

[21] Appl. No.: 782,771

[22] Filed: Oct. 17, 1991

Related U.S. Application Data

[63] Continuation of Ser. No. 563,879, Aug. 6, 1990, abandoned, which is a continuation of Ser. No. 215,865, Oct. 6, 1988, abandoned.

[30] Foreign Application Priority Data

Feb. 27, 1987 [JP] Japan .................. 62-28640
Sep. 8, 1987 [JP] Japan .................. 62-224425
Nov. 20, 1987 [JP] Japan .................. 62-293560
Nov. 20, 1987 [JP] Japan .................. 62-293562

[51] Int. Cl.5 .......................... H01L 41/08
[52] U.S. Cl. .................... 29/25.35; 310/344
[58] Field of Search ........... 29/25.35; 310/340, 344, 310/348, 351–353

[56] References Cited

U.S. PATENT DOCUMENTS

| | | | |
|---|---|---|---|
| 2,503,429 | 4/1950 | Ziegler | 310/344 |
| 2,577,576 | 12/1951 | Glickman et al. | 310/344 |
| 2,656,473 | 10/1953 | Warner, Jr. | 310/353 X |
| 3,221,189 | 11/1965 | Brandt et al. | 310/353 X |
| 3,931,388 | 1/1976 | Hafner et al. | 310/344 |
| 3,970,880 | 7/1976 | Deutschmann et al. | 310/353 X |
| 4,110,655 | 8/1978 | Hata et al. | 310/344 |
| 4,266,156 | 5/1981 | Kizaki | 310/344 |
| 4,293,986 | 10/1981 | Kobayashi et al. | 310/344 X |
| 4,620,438 | 11/1986 | Howng | 310/338 X |
| 4,703,656 | 11/1987 | Bhardwaj | 310/336 X |
| 4,746,831 | 5/1988 | Ichino | 310/327 X |

FOREIGN PATENT DOCUMENTS

| | | |
|---|---|---|
| 54-35870 | 3/1979 | Japan . |
| 54-43490 | 4/1979 | Japan . |
| 56-157827 | 11/1981 | Japan . |
| 57-112119 | 7/1982 | Japan . |
| 58-168317 | 10/1983 | Japan . |
| 59-36410 | 2/1984 | Japan . |
| 678471 | 9/1991 | Switzerland . |

Primary Examiner—Mark O. Budd
Attorney, Agent, or Firm—Blum Kaplan

[57] ABSTRACT

The invention relates to a piezoelectric oscillator wherein a case and a stem are coated with a solder containing 90% and higher of lead, an inner lead is also coated with the solder thereby fixing a piece of piezoelectric oscillator by melting the solder. The invention further relates to a piezoelectric oscillator wherein the piezoelectric oscillator is performed casing by resin or metallic plate, and to a piezoelectric oscillating apparatus wherein IC and a piezoelectric oscillator are internally mold to achieve a molding of high efficiency without inferiority while surface mounting.

7 Claims, 9 Drawing Sheets

METHOD OF MANUFACTURING A PRESSURE SEAL TYPE PIEZOELECTRIC OSCILLATOR

This is a continuation of application Ser. No. 07/563,879, filed Aug. 6, 1990, which is a continuation of Application Ser. No. 07/265,865, filed on Oct. 6, 1988 now abandoned.

TECHNICAL FIELD

The present invention relates to a pressure seal type piezoelectirc oscillator wherein a piece of quartz oscillator is sealed in case by use of a press-fitting system of case, a resin mold type piezoelectric oscillator wherein the pressure seal type piezoelectric oscillator is packaged by resin, a case-inserted type piezoelectric oscillator having a separate case with the pressure seal type piezoelectric oscillator inserted therein and a piezoelectric oscillating apparatus wherein the pressure seal type piezoelectric oscillator and an IC having oscillating circuit are sealed by resin.

TECHNICAL BACKGROUND

A conventional piezoelectric oscillator have been employed a fastening method by adhesive agent 101 or a fastening method by solder having the ratio of Sn to Pb, 6:4 or 9:1, for fastening a piece of piezoelectric oscillator. Further, pressure seal method in which the case is coated with solder 102 or gold by plating, welding method and cold pressure welding method are employed for sealing.

Furthermore, a conventional resin mold piezoelectric oscillator is constructed as depicted in FIG.16. This piezoelectric oscillator is a integrally formed oscillator in which a piece of piezoelectirc oscillator 103 is adhered to inner lead 105 of stem 104 by an adhesive agent such as polyimide series one, stem 104 and case 106 are sealed by gold as shielding material 107 and the pressure seal type piezoelectric oscillator and the lead frame are adhered by welding.

A conventional piezoelectric oscillator have been constructed as depicted in FIG.17, wherein the above-described pressure seal type piezoelectric oscillator 109, semiconductor 110 which electically oscillates pressure seal type piezoelectric oscillator 109 and the lead frame which electrically connects pressure seal type piezoelectric oscillator 109 with semiconductor 110 have been molded by resin 111.

However, when the above-described prior art is employed as SMT (Surface Mount Technology) parts, the temperature of the whole parts rises up to 220°-260° C. when they are packaged on the substrate and the solder containing 40% and less of lead are melted. In addition to this fundamental disadvantage, deterioration of the properties, shift in frequency and in equivalent resistance value of pressure seal type piezoelectric oscillator by gas containing organic components ejected from the soldering are caused.

It is, therefore, an object of the invention to solve the above-described disadvantages and to provide an improved pressure seal type piezoelectric oscillator, resin mold type piezoelectirc oscillator and piezoelectric oscillating apparatus, each having heat resistance applicable for SMT packaging at 260° C. and higher and having properties excellent in high temperature frequency aging.

DESCRIPTION OF THE INVENTION

The present invention is directed to a pressure seal type piezoelectirc oscillator wherein a case and a stem are coated with solder containing 90% and higher of lead therein, a piece of piezoelectric oscillator is adhered by melting the solder coated on an inner lead of the stem and the case and the stem are hermetically sealed by press-fitting method with the solder as a shielding material.

The present invention is directed to a resin mold type piezoelectric oscillator, wherein the case and the stem are coated with solder containing 90% and higher of lead, a piece of piezoelectric oscillator is adhered by melting the solder coated on the inner lead of the stem and an outer lead and a lead frame of the pressure seal type piezoelectric oscillator wherein the case and the stem are hermetically sealed by pressure seal method with the solder as a shielding material are adhered to each other, and such pressure seal type piezoelectric oscillator and the lead frame are integrally molded by resin.

Further, according to the present invention, the case and the stem are coated with solder containing 90% and higher of lead, a piece of piezoelectric oscillator is adhered by melting the solder coated on the inner lead of the stem and the stem are hermetically sealed by press-fitting method with the solder as a shielding material.

The present invention is directed to a case-inserted type piezoelectric oscillator having a rectangular case having a thickness within the range from 0.05 to 1.5 mm and whose coross section has one or more corners at the periphery of cylindrical pressure seal type piezoelectric oscillator excepting the lead portion.

Furthermore, the present invention is directed to a pressure seal type piezoelectric oscillating apparatus wherein the case and the stem are coated with the solder containing 90% and higher of lead, a piece of piezoelectric oscillator is adhered by melting the solder coated on the inner lead of the stem, and further a pressure seal type piezoelectric oscillator wherein the case and the stem are hermetically sealed by press-fitting method with the solder as a shielding material, a semiconductor (IC) for electrically oscillating the pressure seal type piezoelectric oscillator and the lead frame are molded by resin.

BEST MODE FOR CARRYING OUT THE INVENTION

Figure 1:
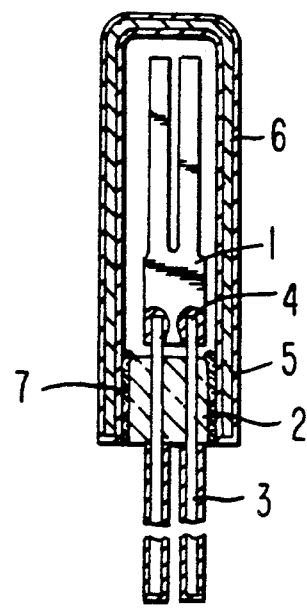
FIG. 1 is a structural view of a pressure seal type piezoelectric oscillator constructed in accordance with the invention.
Figure 2:
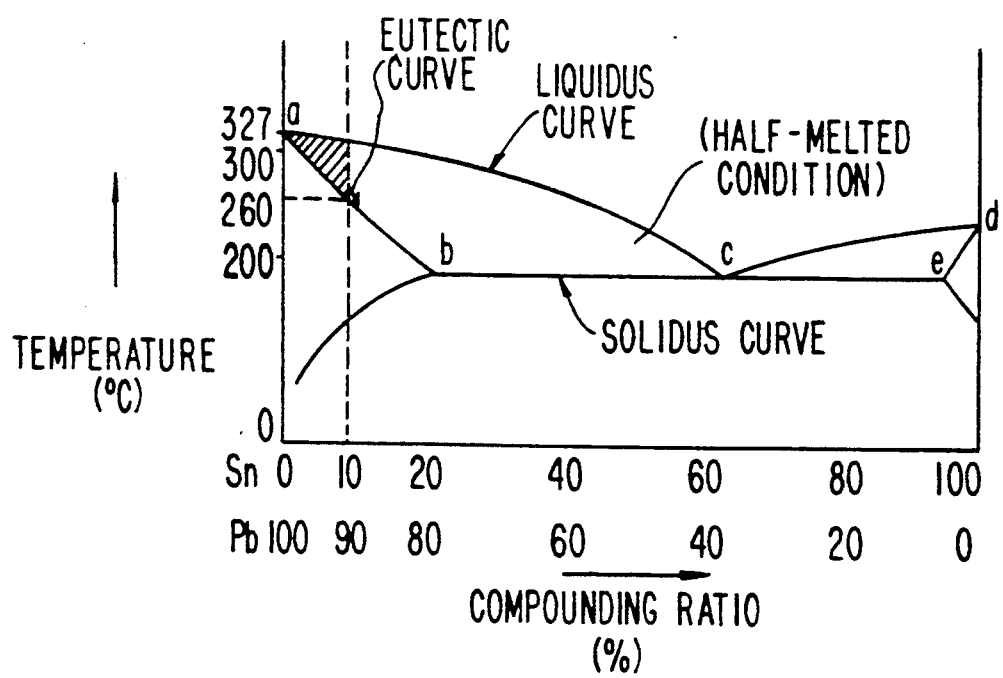
FIG. 2 is a graph showing condition of a solder.
Figure 3:
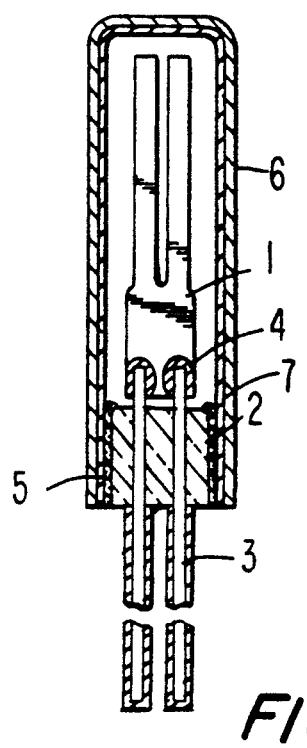
FIG. 3 is a structural view of a pressure seal type piezoelectric oscillator constructed in accordance with an alternate embodiment of the invention.
Figure 4:
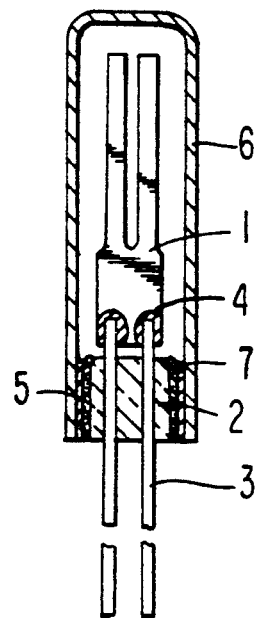
FIG. 4 is a structural view of the pressure seal type piezoelectric oscillator constructed in accordance with another embodiment of the invention.

FIG. 1 shows a structural view of a quartz oscillator as an embodiment of a pressure seal type piezoelectric oscillator of the present invention. A tuning fork-shaped piece of quartz oscillator 1 which is made of quartz plate by photolithography is adhered to lead 3 of stem 2 wherein lead 3 is sealed to metallic ring 7 with glass, by high-temperature solder 4 provided thereon by plating having melting point of 260° C. and higher and the ratio Sn to Pb about 1:9 as shown in FIG. 2, a graph showing conditions of solder. Further, a quartz oscillator is completed when case 6 coated with high-temperature solder 5 is hermetically sealed by press-fitting method. Since Sn is cracked or broken at very low temperature at times, the solder with a large amount of Pb has good heat resistance and is stable at very low temperature. High heat resistance and operation efficiency are required for the solder so that a high-temperature solder containing not only Sn and Pb but also with a third metal such as Ag can be applicable. Generally, a rotating type plating method is employed for plating the pressure seal type stem and case with the solder so that the solder is adhered to entire metallic portion of stem 2 and case 6. Then, the organic components in the condition of gas are ejected from the plating, resulting in a deterioration in properties, such as an adhesion of the gas to a piece of oscillator or lowering the degree of vacuum. The deterioration in properties is also caused when not entire metallic portion but only the inner periphery of case 6 is plated with the solder as shown in FIG. 3. Therefore, partial plating, such as that high-temperature solder 4 is used at the fastening portion of quartz oscillator piece 1 with lead 3 and high-temperature solder 5 at the sealing portion of stem 2 with case 6 is more desirable. If quartz oscillator piece 1 is hermetically sealed at high temperature (room temperature to 260° C.) in case that the entire metallic portion of the case and of the stem are plated with the solder, the equivalent resistance value is extremely increased (100% and higher, on ocasion) and aging in frequency is caused considerably, which sometimes stops oscillating. Accordingly, before and/or while stem 2 is hermetically press-sealed into case 6, the gas should be ejected outward by heat baking. Desirable temperature for such baking is indicated in FIG. 2 as the temperature within the portion marked with slant lines surrounded by eutectic curve ab, liquidus curve ac and a line indicating 90% of lead content. Organic components can be ejected thoroughly by heat baking in this condition, thereby limiting the increase in the equivalent resistance value within several %.

Further, when press-fitting method is applied, the high-temperature solder is plated at least on the side of the case of sealing portion so that airtightness can be maintained. The metallic ring of the stem can also be plated with Ni or Cu.

The above-described structure can be achieved with the manufacturing technique similar to the conventional one while being inexpensive to manufacture with low cost materials, which achieves mass production and miniature in size. Becuase, large burden in the process in which quartz oscillator piece is adhered can be lightened by applying the solder melting method, which results in an easier production. Further, the production also becomes easier with low cost materials by applying the press-fitting method as sealing method.

As the conventional quartz oscillator has low heat-resistance property, the mounting method similar to one applied for the SMT which has taken rapid strides in these days has not been applied. However, the pressure seal type quartz oscillator of the present invention can be mounted simultaneously with the SMT parts. The quartz oscillator can be confirmed that no deterioration of properties thereof is caused at 260° C. of the mounting temperature and at 150° C. of preservation temperature.

This embodiment is described employing a tuning fork-shaped quartz oscillator piece, and other piezoelectric oscillator piece having different configuration and material such as a rectangular AT cut quartz oscillator piece or tantalic acid lithium oscillator piece are confirmed that no deterioration of heat-resistance property is caused.

Figure 5:
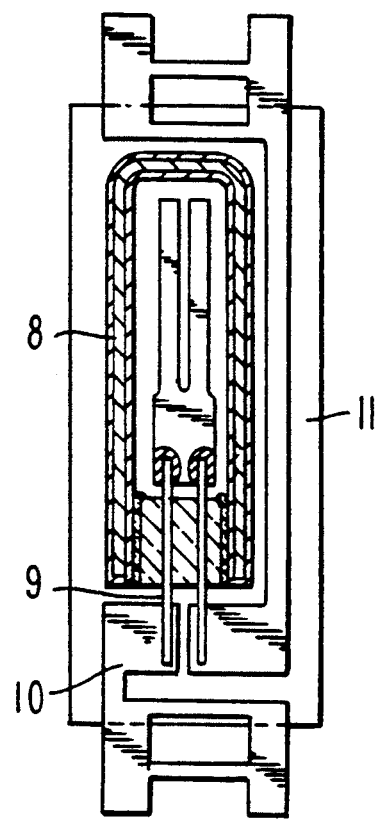
FIG. 5 is a structural view of a resin mold type piezoelectric oscillator constructed in accordance with another embodiment of the invention.
Figure 6:
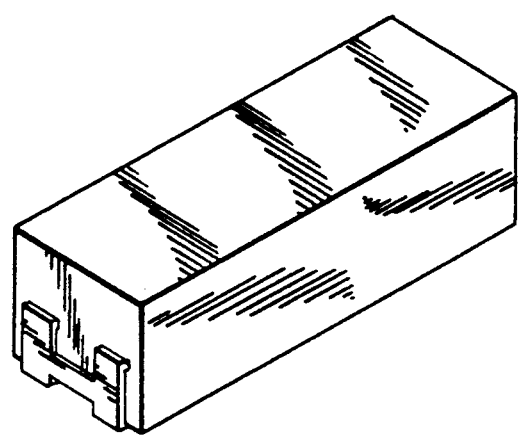
FIG. 6 is a perspective view of a resin mold type piezoelectric oscillator of the invention.
Figure 7:
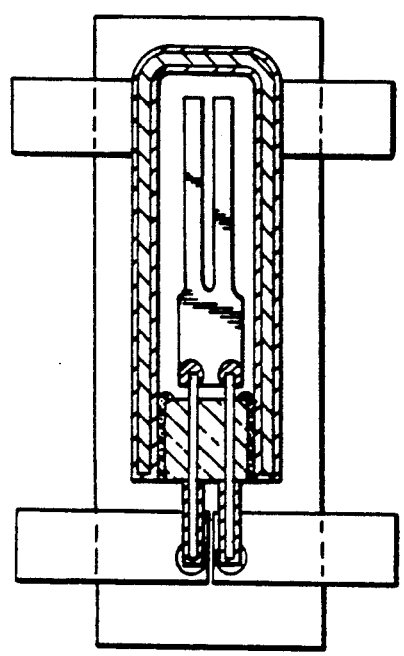
FIG. 7 is a structural view of a resin mold type piezoelectric oscillator constructed in accordance with an application embodiment of the invention.
Figure 8:
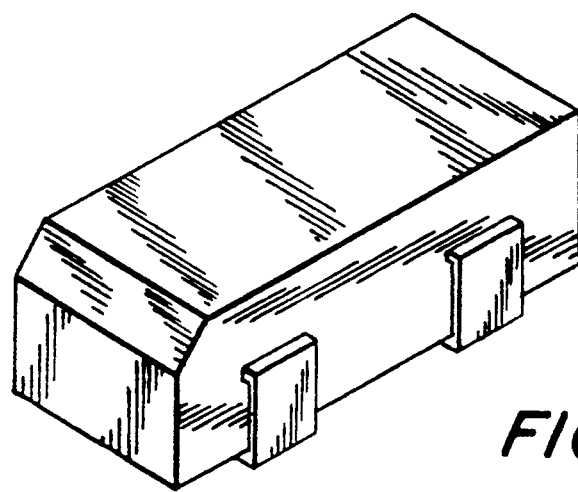
FIG. 8 is a perspective view of a resin mold type piezoelectric oscillator constructed in accordance with an application embodiment of the invention.

The resin mold type piezoelectric oscillator is adhered to lead fram 10 by a method such as that the solder of outer lead 9 of pressure seal type piezoelectric oscillator 8 is melted, as shown in FIG. 5. The welding is more sufficient for solid adhesion. The resin mold type pressure seal piezoelectric oscillator can be completed by integral molding of these members with epoxy or phenol series resin 11. FIG. 6 is a perspective view showing a structure wherein the lead frame is brought out to the end portion. In this structure, the lead frame is bent inside toward the base, which is called as J-bend, but the lead frame can be bent outside, which is called as gullwing. Further, the lead frame can be brought out to the side face as shown in FIG. 7. FIG. 8 is a perspective view thereof. It is better to perform marking, such as to round off the corners of the periphery of resin, in order to distinguish the lead which is to be conducted for operating the piezoelectric oscillator from other leads.

Figure 9:
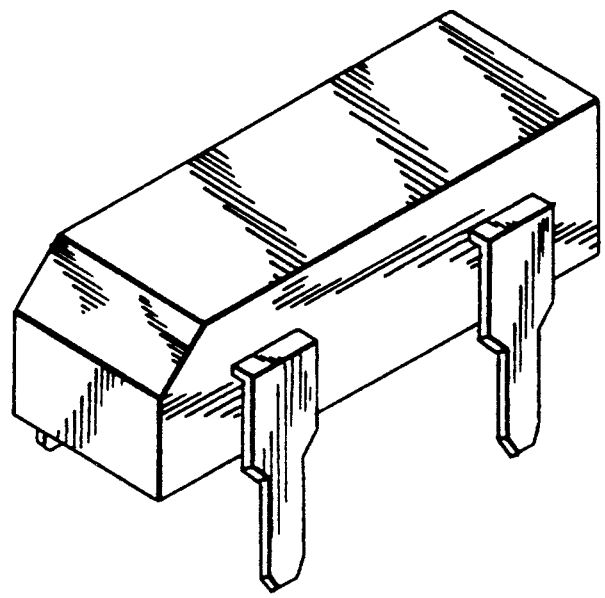
FIG. 9 is a perspective view of a resin mold type piezoelectric oscillator constructed in accordance with another embodiment of the invention.

FIG. 9 is a perspective view of a resin mold type piezoelectric oscillator constructed in accordance with an alternate embodiment of the invention. The above-described embodiment relates to the structure of surface mounting type, but the lead-inserted type is also applicable.

Figure 10:
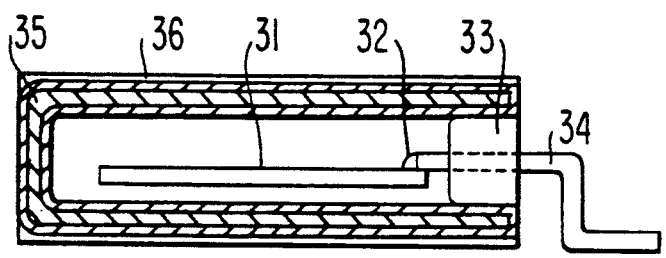
FIG. 10 is a structural view of a case-inserted type piezoelectric oscillator of the invention.
Figure 11A:
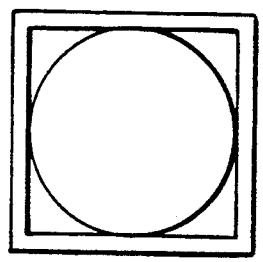
FIG. 11(a) is a cross-sectional view of a case-inserted type piezoelectric oscillator of the invention.
Figure 11B:
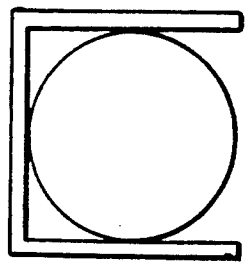
FIG. 11(b) is a cross-sectional view of a case-inserted type piezoelectric oscillator constructed in accordance with another embodiment of the invention.
Figure 11C:
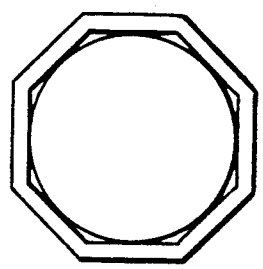
FIG. 11(c) is a cross-sectional view of a case-inserted type piezoelectric oscillator constructed in accordance with another embodiment of the invention.

According to a case-inserted type piezoelectric oscillator, rectangular case 36 is attached to the periphery of the above-described pressure seal type piezoelectric oscillator and lead 34 is bent, as shown in FIG. 10. Rectangular case 36, if it is made of metal, has a thickness within the range from 0.05 to 1.5 mm, whereby it can be molded by a method such as press easily. Further, rectangular case 36 can also be made of resin. It is fixed by welding, adhesive agent or fitting. The configuration of the rectangular case can be a polygon having three or eight faces as well as one having four faces, as shown in FIG. 11. The rectangular case made of metal can also be applied as an earth.

Figure 12A:
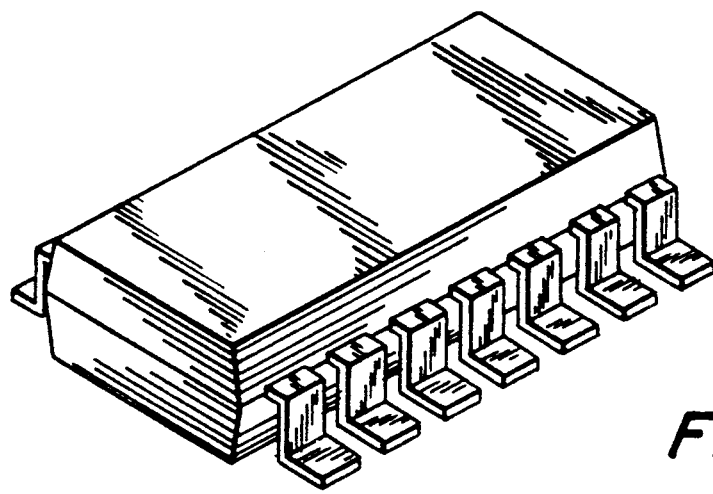
FIG. 12 is a perspective view of a piezoelectric oscillator in use of a pressure seal type piezoelectric oscillator of the invention.
Figure 13A:
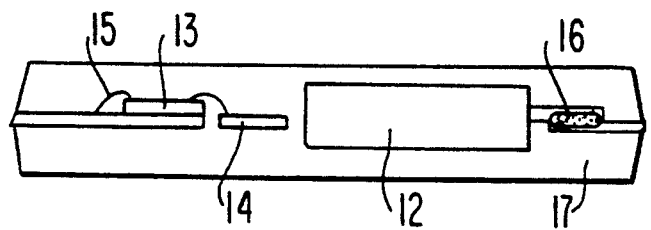
FIG. 13(a) is a cross-sectional view of a piezoelectric oscillator in use of a pressure seal type piezoelectric oscillator of the invention.
Figure 13B:
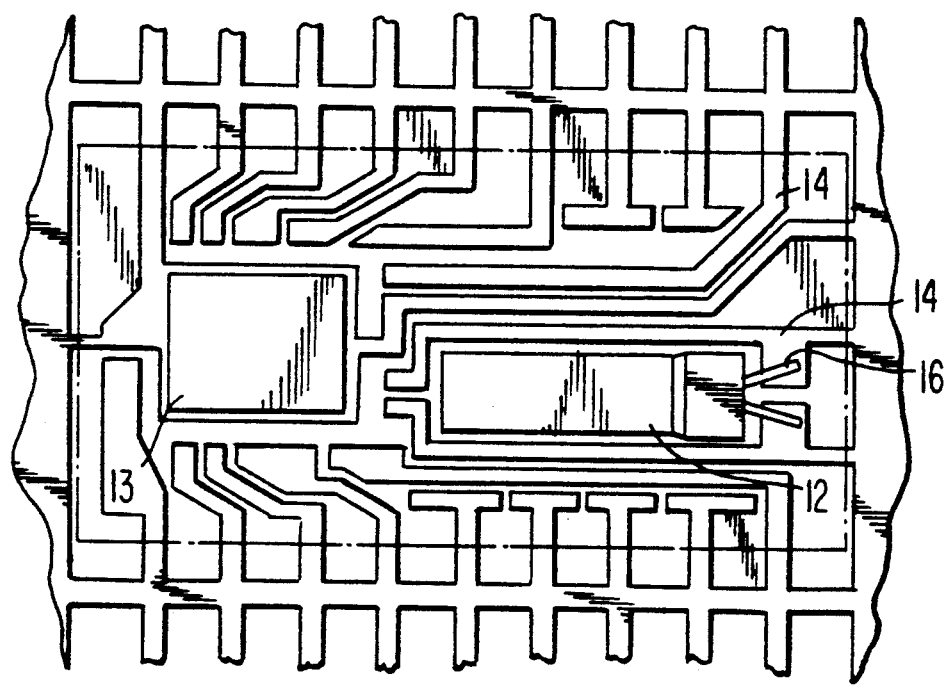
FIG. 13(b) is a main plan view showing a piezoelectric oscillator constructed in use of a pressure seal type piezoelectric oscillator of the invention.

Next, according to the first embodiment of a piezoelectric oscillator in use of the pressure seal type piezoelectric oscillator of the invention as shown in FIGS. 12 and 13, pressure seal type piezoelectric oscillator 12 and semiconductor 13 for electrically oscillates oscillator 12 are arranged on the same plane, and they are electrically connected to form a oscillation circuit, by melting the wire bonding of metallic fine wire 15 and the solder of outer lead 16 of pressure seal type piezoelectric oscillator 12 through lead frame 14. The piezoelectric oscillator further comprises resin 17 including pressure seal type piezoelectric oscillator 12, semiconducntor 13, lead frame 14 and metallic fine wire 15. Since lead frame 14 is not rigid enough and the wire can be cut down on ocasion when pressure seal type piezoelectric oscillator 12 is adhered thereto, it is to be desired that lead 41 is arranged on the opposite side to the location of semiconductor 13 and near outer frame 42 of the lead frame.

Figure 14A:
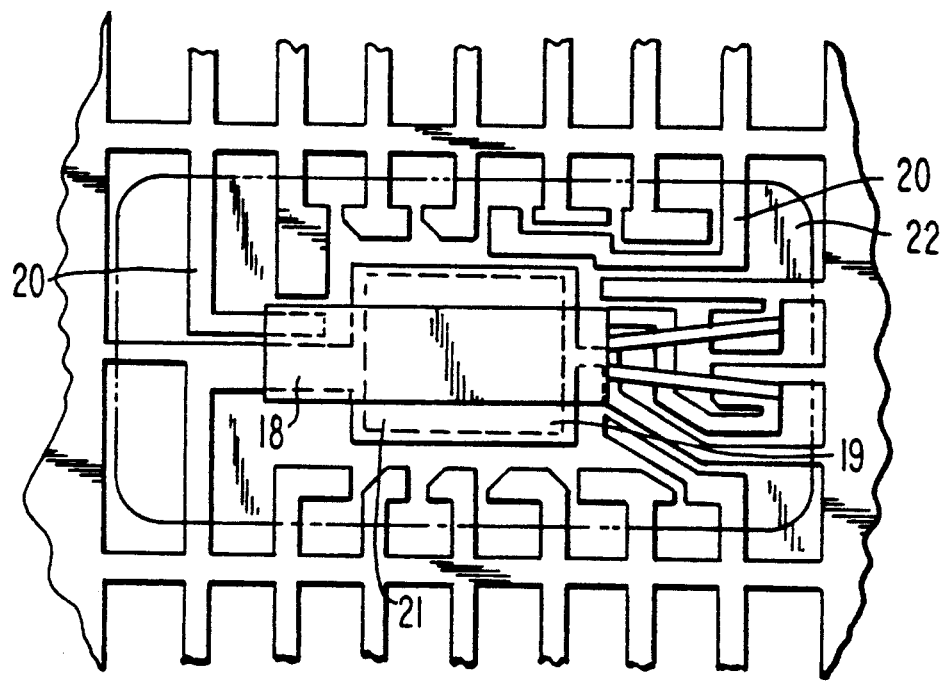
FIG. 14(a) is a main plan view of a piezoelectric oscillator constructed in accordance with the invention.
Figure 14B:
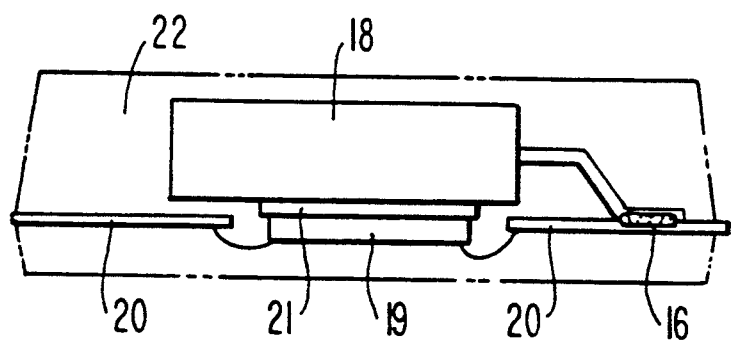
FIG. 14(b) is a main cross-sectional view of a piezoelectric oscillator of the invention.
Figure 15:
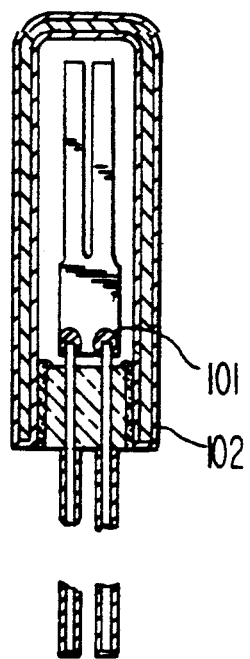
FIG. 15 is a cross-sectional view of a conventional presssure seal type piezoelectric oscillator.
Figure 16:
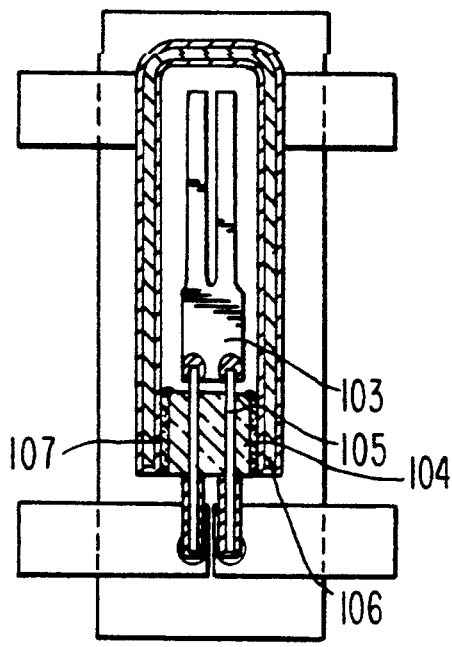
FIG. 16 is a structural view of a conventional resin mold type piezoelectric oscillator.
Figure 17:
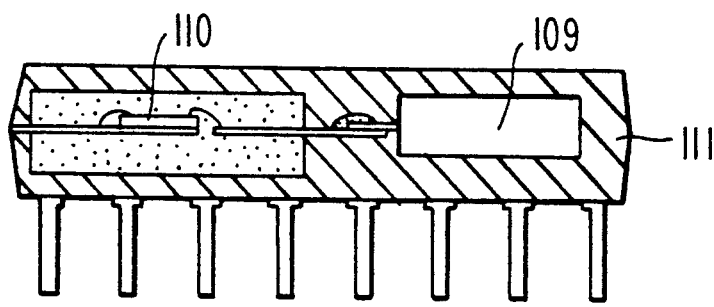
FIG. 17 is a main cross-sectional view of a conventional piezoelectric oscillator.

The second embodiment of the piezoelectric oscillator is described referring to FIGS. 14(a) and 14(b), in which pressure seal type piezoelectric oscillator 18 and semiconductor 19 which electrically oscillates oscillator 18 are disposed on the upper surface and the lower surface of lead frame 20 respectively and tab 21 of lead frame 20 to which semiconductor 19 is adhered is pushed out toward the side of piezoelectric oscillator 18 to make a parallel contact with pressure seal type piezoelectric oscillator 18, thereby maintaining a clearance for electric insulation between pressure seal type piezoelectric oscillator 18 and lead frame 20. This prevents not only the electric conduction between piezoelectric oscillator 18 and a plurality of lead frame 20 but also short circuit between lead frames 20. According to this structure, the area is a half of that of the case wherein pressure seal type piezoelectric oscillator and the semiconductor are arranged on the plane and the thickness is a sum of the minimum thicknesses of each part.

In the end, the entire body is mold by heat resistant resin 22 including piezoelectric oscillator 18, semiconductor 19 and lead frames 20 and 21.

According to the piezoelectric oscillator described in the above embodiment, the portion to which the piece of oscillator is attached by the solder, the bonding portion between the case and the stem and that between the lead of pressure seal type piezoelectric oscillator and the lead frame are so constructed to have 260° C. and higher heat resistance, including the other parts.

The configuration of the entire body is the form of lead frame, which is called gullwing, for flat package corresponding to SMT as shown in FIG. 12. It can be applied to a form of lead-inserted as an insertion part such as DIP(dusl in-line package) type.

It can further be applied to a form of J-bend lead frame for flat package as an embodiment.

According to the piezoelectric oscillator described in the above embodiment, the case and the stem are coated with the solder containing 90% and higher of lead, the piece of piezoelectric oscillator is adhered by melting the solder coated on the inner lead of the stem and the case and the stem are hermetically sealed with the solder as a shielding material by the pressure seal method. Therefore, the piezoelectric oscillator can be adhered directly by the solder coated on the lead without using adhesive agent and the case and the stem can be pressure sealed directly by the solder coated thereon, which renders a pressure seal type piezoelectric oscillator having sufficient heat resistance being inexpensive for materials thereof and production. Further, since the case and the stem to which the piece of piezoelectric oscillator is adhered by melting the solder are hermetically sealed by the pressure seal method at the temperature wherein the solder is melted, the piezoelectric oscillator having low equivalent resistance value, improved temperature ageing properties and reliability can be obtained.

Further, according to the resin mold type piezoelectric oscillator of the present invention, the case and the stem are coated with the solder containing 90% and higher of lead, the piece of piezoelectric oscillator is adhered by melting the solder coated on the innner lead of the stem, and the case and the stem are hermetically sealed with the solder as a shileding material by the press-fitting method. Furthermore, the outer lead of such pressure seal type piezoelectric oscillator is adhered to the lead frame and the pressure seal type piezoelectric oscillator and the lead frame are integrally mold by resin. Hence, an inexpensive piezoelectric oscillator having high quality and sufficient heat resistance, which is further convenient to operate for automatic mounting and the like, can be obtained.

Furhtermore, according to the case-inserted type piezoelectric oscillator of the present invention, the case and the stem are coated with the solder containing 90% and higher of lead, the piece of piezoelectric oscillator is fixed by melting the solder coated on the inner lead of the stem, a rectangular case having a thickness within the range from 0.05 to 1.5 mm and whose periphery in the cross section has one or more corners excepting the lead portion of the pressure seal type piezoelectric oscillator wherein the case and the stem are hermetically sealed with the solder as a shielding material by the pressure seal method is attached. Therefore, an inexpensive piezoelectric oscillator having high quality and sufficient heat resistance, which is further convenient to operate for automatic mounting and the like, can be obtained.

According to the the piezoelectric oscillating apparatus of the present invention, the case and the stem are coated with the solder containing 90% and higher of lead and the solder is used as a mounting material of the piece of oscillator and a hermetically shielding material, and the lead of the piezoelectric oscillator is weld as a composition metal layer wherein metallic lead of the lead frame contains 90% and higher of lead, thereby achieving piezoelectric oscillating apparatus having 260° C. and higher heat resistance.

In addition, the pressure seal type piezoelectric oscillator and the semiconductor are disposed on either side of the lead frame respectively and they are insulated by pushing out the tab of the lead frame, thereby providing a small-sized piezoelectric oscillator having good heat resistance can be provided.

What is claimed is:

1. A method of manufacturing a pressure seal type piezoelectric oscillator, comprising:
    (a) coating a high-temperature solder on at least a portion of an oscillator case having an opening, or on a stem for sealing the case opening, the solder comprising at least about 90% Pb;
    (b) coating the solder on at least a part of an inner lead which passes through the stem;
    (c) positioning a portion of a quartz crystal oscillator on the solder coated in step (b) such that the quartz crystal oscillator and the inner lead are adhered to each other;
    (d) heat baking the solder from step (a) while the solder is in a semi-fluid condition to remove dissolved gas; and
    (e) press-combining the case and the stem to convert the solder between the case and stem into a sealing material.

2. The method of claim 1, wherein steps (d) and (e) are carried out simultaneously.

3. The method of claim 1, wherein the solder between the case and stem hermetically seals the case and the stem.

4. The method of claim 1, wherein the solder includes Sn.

5. The method of claim 4, wherein the solder includes Ag.

6. A method of manufacturing a pressure seal type piezoelectric oscillator, comprising:
    (a) coating a high-temperature solder consisting essentially of Sn, Ag and at least 90% Pb, on at least a portion of an oscillator case having an opening, or on a stem for sealing the case opening;
    (b) coating the solder on at least a part of an inner lead which passes through the stem;
    (c) positioning a portion of a quartz crystal oscillator on the solder coated in step (b) such that the quartz crystal oscillator and the inner lead are adhered to each other;
    (d) heat baking the solder from step (a) while the solder is in a semi-fluid condition to remove dissolved gas; and
    (e) press-combining the case and the stem to convert the solder between the case and stem into a sealing material.

7. The method of claim 6 wherein the solder consists essentially of Pb and Sn.

* * * * *